(12) United States Patent
Murayama et al.

(10) Patent No.: US 9,356,424 B2
(45) Date of Patent: May 31, 2016

(54) SEMICONDUCTOR LIGHT EMITTING ELEMENT AND SEMICONDUCTOR LIGHT EMITTING DEVICE

(71) Applicant: Sony Corporation, Tokyo (JP)

(72) Inventors: Masahiro Murayama, Miyagi (JP); Yoshinori Ishiai, Miyagi (JP); Yuichiro Kikuchi, Miyagi (JP)

(73) Assignee: SONY CORPORATION, Tokyo (JP)

( * ) Notice: Subject to any disclaimer, the term of this patent is extended or adjusted under 35 U.S.C. 154(b) by 19 days.

(21) Appl. No.: 14/327,838

(22) Filed: Jul. 10, 2014

(65) Prior Publication Data

US 2015/0023379 A1 Jan. 22, 2015

(30) Foreign Application Priority Data

Jul. 19, 2013 (JP) ................. 2013-150641

(51) Int. Cl.
| | |
|---|---|
| *H01L 27/15* | (2006.01) |
| *H01L 21/00* | (2006.01) |
| *H01S 5/042* | (2006.01) |
| *H01S 5/024* | (2006.01) |
| *H01S 5/022* | (2006.01) |
| *H01S 5/22* | (2006.01) |
| *H01S 5/343* | (2006.01) |

(52) U.S. Cl.
CPC ........... *H01S 5/0425* (2013.01); *H01S 5/02476* (2013.01); *H01L 2924/01046* (2013.01); *H01S 5/0224* (2013.01); *H01S 5/02272* (2013.01); *H01S 5/22* (2013.01); *H01S 5/34333* (2013.01); *H01S 2301/176* (2013.01)

(58) Field of Classification Search
CPC ............................................. H01L 2924/12041
USPC .............. 438/39, 679, 686; 372/43.01–52.23; 257/86, 761–770
See application file for complete search history.

(56) References Cited

U.S. PATENT DOCUMENTS

| | | | | |
|---|---|---|---|---|
| 6,697,406 | B2 * | 2/2004 | Yamamura | H01S 5/164 372/46.01 |
| 7,606,278 | B2 * | 10/2009 | Kuramoto | B82Y 20/00 372/43.01 |
| 8,680,557 | B2 * | 3/2014 | Shinbori | H01L 33/46 257/98 |
| 2010/0046566 | A1 * | 2/2010 | Kudo | B82Y 20/00 372/45.01 |

FOREIGN PATENT DOCUMENTS

JP 2007-027181 2/2007

* cited by examiner

*Primary Examiner* — Calvin Lee
(74) *Attorney, Agent, or Firm* — Dentons US LLP

(57) ABSTRACT

There is provided a semiconductor light emitting element that is excellent in reliability and is capable of being driven by a lower voltage and a semiconductor light emitting device that includes the semiconductor light emitting element. The semiconductor light emitting element includes: a semiconductor layer; an electrode layer; a metal layer that contains a hydrogen storage metal; and a plated layer in order.

7 Claims, 4 Drawing Sheets

SEMICONDUCTOR LIGHT EMITTING ELEMENT AND SEMICONDUCTOR LIGHT EMITTING DEVICE

This application claims the benefit of Japanese Priority Patent Application JP2013-150641 filed Jul. 19, 2013, the entire contents of which are incorporated herein by reference.

BACKGROUND

The present disclosure relates to a semiconductor light emitting element and a semiconductor light emitting device that includes the semiconductor light emitting element.

In general, a semiconductor laser is weak against heat, and therefore the characteristics of the semiconductor layer may be sometimes remarkably deteriorated with increasing the temperature of an element. Since a heating value of the semiconductor laser is also increased as high-powering of the semiconductor laser is promoted, it becomes important to emit heat generated from the semiconductor laser to the outside.

In emitting the heat generated in a semiconductor layer to the outside, it is effective to cover a light emitting point projected stripe part of the semiconductor layer with a heat radiation layer made of metals such as Au (gold), and so forth that are high in thermal conductivity. Since it is possible to increase the heat capacity of the heat radiation layer to increase heat radiation efficiency thereof by increasing the thickness of the heat radiation laser, the heat radiation layer is formed by a plating method from the viewpoint of manufacturing efficiency (see, for example, Japanese Unexamined Patent Application Publication No. 2007-27181).

SUMMARY

Although an electroplating method and an electroless plating method may be available as the plating method for a plated layer made of, for example, Au, Au is precipitated on a surface of a sample by immersing the sample in a solution that contains metal ions (Au ions) in both cases. However, in the course of precipitating Au, hydrogen is generated as a reaction by-product and much hydrogen is taken into an Au plated film that has been formed by precipitation.

For a nitride semiconductor layer, hydrogen storage metals such as Ni (nickel) and Pd (palladium) are frequently used for a p-side contact electrode, and therefore it sometimes occurs that hydrogen that has been taken into the Au plated film is occluded into the p-side contact electrode and the hydrogen so occluded is emitted again into the semiconductor layer.

However, occlusion of hydrogen into the p-side contact electrode may possibly cause deterioration of a crystal structure of the electrode and an increase in contact resistance of the electrode. Further, the hydrogen that has been emitted again into the semiconductor layer may combine with, for example, Mg that is a p-type impurity to hinder generation of carriers and may possibly cause an increase in resistance of the semiconductor layer. As a result, occurrence of the above-mentioned situations may lead to a rise in voltage to drive a semiconductor light emitting element.

Although heat treatment and so forth to be performed for expelling the hydrogen that has been taken into a gold plated film are known, complete removal of the hydrogen is difficult. In addition, second hydrogen adsorption may possibly occur in the subsequent manufacturing process. Further, thermal damage to the semiconductor light emitting element itself caused by heating may be feared.

It is desirable to provide a semiconductor light emitting element that is excellent in reliability and is capable of being driven by a lower voltage and a semiconductor light emitting device that includes the semiconductor light emitting element.

According to an embodiment of the present disclosure, there is provided a semiconductor light emitting element that includes a semiconductor layer, an electrode layer, a metal layer that contains a hydrogen storage metal; and a plated layer in order.

According to an embodiment of the present disclosure, there is provided a semiconductor light emitting device that includes a base; and a semiconductor light emitting element, the semiconductor light emitting element being joined to the base via a junction layer and being configured by laminating a plated layer, a metal layer that contains a hydrogen storage metal, an electrode layer, and a semiconductor layer in order from the base side.

In the semiconductor light emitting element and the semiconductor light emitting device according to the respective embodiments of the present disclosure, since the metal layer that contains the hydrogen storage metal is provided between the plated layer and the electrode layer, hydrogen generated in formation of the plated layer is occluded into the hydrogen storage metal contained in the metal layer. Therefore, intrusion of hydrogen into the electrode layer is suppressed.

According to the semiconductor light emitting element and the semiconductor light emitting device according to the respective embodiments of the present disclosure, it is possible to effectively prevent intrusion of the hydrogen contained in the plated layer into the electrode layer by the metal layer that contains the hydrogen storage metal. Therefore, it is possible to avoid deterioration of the crystal structure of the electrode and increase in contact resistance of the electrode, and thus the reliability is improved. In addition, it is possible to reduce the voltage to drive the semiconductor light emitting element.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, embodiments of the present disclosure will be described in detail with reference to the accompanying drawings. It is to be noted that description will be made in the following order.
1. First Embodiment
   A semiconductor light emitting element that includes a semiconductor layer provided with a projected stripe part
2. Second Embodiment
   A semiconductor light emitting device that the semiconductor light emitting element according to the first embodiment is joined to a base <First Embodiment>
[Structure of Semiconductor Light Emitting Element 10]

Figure 1:
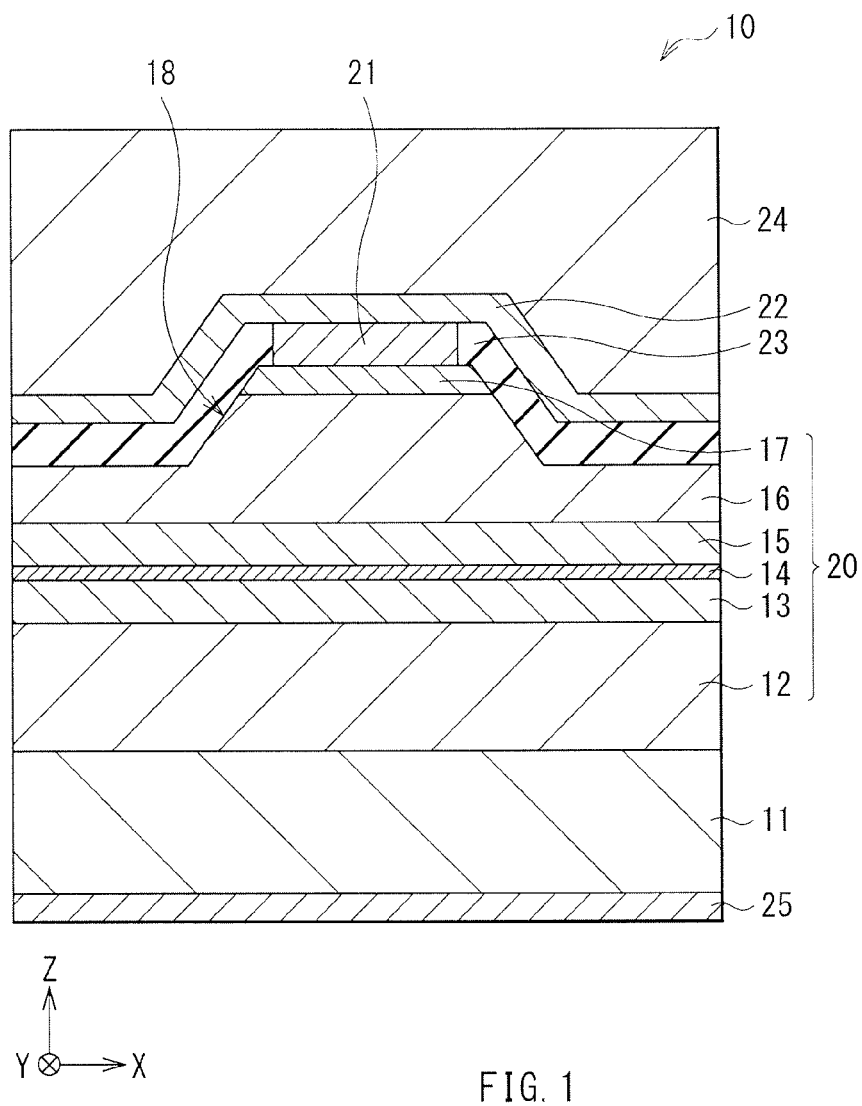
FIG. 1 is a sectional diagram illustrating a schematic structure of a semiconductor light emitting element according to a first embodiment of the present disclosure.

FIG. 1 is a diagram illustrating a sectional structure of the semiconductor light emitting element (a semiconductor laser element) 10 according to the first embodiment of the present disclosure.

The semiconductor light emitting element 10 may be configured by growing, for example, a group III-V nitride semiconductor layer (hereinafter, simply referred to as a semiconductor layer) 20 on a substrate 11 (a nitride semiconductor substrate) made of GaN. Here, the group III-V semiconductor nitride means a gallium-nitride-based compound that contains Ga (gallium) and nitrogen (N). Examples of the gallium-nitride-based compound may include GaN, AlGaN (aluminum gallium nitride), AlGaInN (aluminum gallium indium nitride) and so forth. The above-mentioned compounds each contain an n-type impurity that contains group IV and group VI elements such as Si (silicon), Ge (germanium), O (oxygen), Se (selenium) and so forth or a p-type impurity that contains group II and group IV elements such as Mg (magnesium), Zn (zinc), C (carbon) and so forth as necessary.

The semiconductor layer 20 has a laser structure (a light emitting element structure) configured by laminating in order an n-type cladding layer 12, an n-type guide layer 13, an active layer 14, a p-type guide layer 15, a p-type cladding layer 16, and a p-type contact layer 17 on the substrate 11. It is to be noted that in the following, a lamination direction (a Z-axis direction) of the semiconductor layer 20 will be referred to as a longitudinal direction, a direction that laser light is emitted will be referred to as an axial direction (a Y-axis direction), and a direction that is vertical to the axial direction and the longitudinal direction will be referred to as a lateral direction (an X-axis direction).

The n-type cladding layer 12 may be made of, for example, n-type AlGaN, and the n-type guide layer 13 may be made of, for example, n-type GaN. The active layer may have, for example, an undoped GaInN multi-quantum well structure. The p-type guide layer 15 may be made of, for example, p-type GaN, the p-type cladding layer 16 may be made of, for example, AlGaN, and the p-type contact layer 17 may be made of, for example, p-type GaN.

In addition, part of the p-type cladding layer 16 and the p-type contact layer 17 configure a belt-like ridge part (the projected stripe part) 18 that extends in the axial direction. In the active layer 14, a region corresponding to the ridge part 18 serves as a current injection region (a light emitting region). It is to be noted that the ridge part 18 has a function of restricting the size of the current injection region of the active layer 14 and controlling an optical mode in the lateral direction stably to a basic (0-order) mode to guide light in the axial direction.

Both side surfaces of the ridge part 18 are covered with an insulation layer 23. A p-side contact electrode layer 21 that is ohmic-connected with the p-type contact layer 17 of the ridge part 18 is formed on the p-type contact layer 17. In addition, a p-side pad electrode layer 22 is so provided as to cover the p-side contact electrode layer 21 and the insulation layer 23. Further, one pair of reflector films (not illustrated) is formed on end faces (resonator end faces) that are parallel with a face (an XZ plane) vertical to a direction (the axial direction) in which the ridge part 18 extends. Reflectances of the pair of reflector films are different from each other. Therefore, light generated in the active layer 14 is amplified while reciprocally traveling between the pair of reflector films and is emitted from one of the reflector films as laser beams.

The insulation layer 23 may be made of an insulating material such as $SiO_2$ (silicon dioxide) and SiN (silicon nitride).

The p-side contact electrode layer 21 may preferably be in contact with the p-type contact layer 17 of the semiconductor layer 20 and may preferably contain a metal element having a comparatively large work function. In addition, although the p-side contact electrode layer 21 may have a single layer structure, the p-side contact electrode layer 21 may have preferably a multilayer structure. Specifically, the p-side contact electrode layer 21 may have a structure in which, for example, a Pd (palladium) layer and a Pt (platinum) layer are laminated on the p-type contact layer 17 in this order.

The p-side pad electrode layer 22 is a metal layer that contains a hydrogen storage metal and is so provided as to cover at least the entire of the p-side contact electrode layer 21. In other words, the p-side pad electrode layer 22 is in total contact with an upper surface of the p-side contact electrode layer 21. It is to be noted that the p-side contact electrode layer 21 and the p-side pad electrode layer 22 may not necessarily be in direct contact with each other as long as the both layers 21 and 22 are electrically connected with each other. In other words, another conductive material layer may be provided between the p-side contact electrode layer 21 and the p-side pad electrode layer 22. Examples of the hydrogen storage metal contained in the p-side pad electrode layer 22 may include Pd (palladium) and Ni (nickel). Pd is more preferable, in particular, because Pd is smaller than Ni in membrane stress and therefore it is more difficult to cause delamination of the p-side pad electrode layer 22 when using Pd. In addition, the p-side pad electrode layer 22 may have either the single layer structure or the multilayer structure. When the p-side pad electrode layer 22 has the multilayer structure, for example, a laminate structure that includes the Pd layer and the Ni layer, a laminate structure that includes a Ti (titanium) layer, a Pt (platinum) layer and an Au (gold) layer in addition to the Pd layer and the Ni layer, and so forth may be preferable. Each layer may have a film thickness of, for example, about 10 nm or more and about 1 µm or less. One reason therefore lies in the fact that sufficient hydrogen storage effect is obtained with the film thickness of each layer that is about 10 nm or more. In addition, another reason lies in the fact that occurrence of inter-layer delamination caused by internal stress is suppressed with the film thickness of each layer that is about 1 µm or less.

A plated layer 24 that may be made of, for example, Au is provided on the p-side pad electrode layer 22. The plated layer 24 functions as a heat radiation layer that radiates heat generated from the semiconductor layer 20 when the semiconductor light emitting element 10 has been driven, to the outside. A formation region of the plated layer 24 may coincide with a formation region of the p-side pad electrode layer 22 or the plated layer 24 may be so formed as to cover only part of the p-side pad electrode layer 22. Alternatively, the plated layer 24 may be so formed as to cover the entire p-side pad electrode layer 22 and a peripheral region thereof. It is to be noted that the plated layer 24 and the p-side pad electrode layer 22 may not necessarily be in direct contact with each other as long as the both layers 24 and 22 are electrically connected with each other. In other words, another conductive material layer may be provided between the plated layer 24 and the p-side pad electrode layer 22. In addition, it is sufficient for the plated layer 24 to have a film thickness of, for example, about 100 nm or more and about 10 μm or less. Sufficient heat radiation effect is obtainable with the film thickness of the plated layer 24 that is about 100 nm or more. In addition, it is possible to suppress delamination of the plated layer 24 from the p-side pad electrode layer 22 caused by the internal stress of the plated layer 24 with the film thickness of the plated layer 24 that is about 10 μm or less.

An n-side electrode layer 25 is provided on a back surface of the substrate 11. The n-side electrode layer 25 may have a structure in which, for example, the Ti layer, the Pt layer, and the Au layer are laminated in order from the substrate 11 side.

[Method of Manufacturing Semiconductor Light Emitting Element 10]

The semiconductor light emitting element 10 so configured may be manufactured, for example, in the following manner.

Figure 2A:
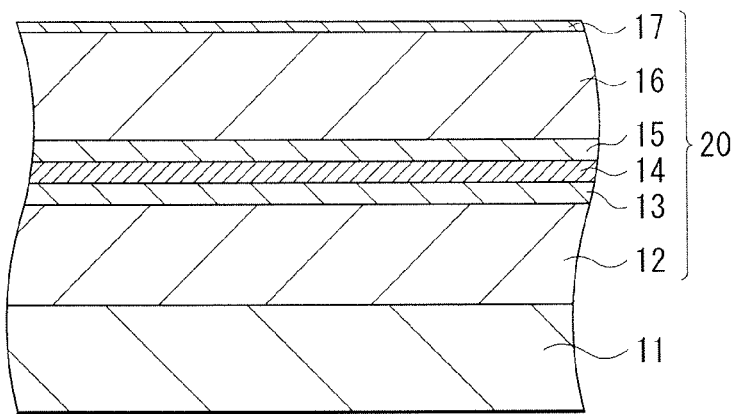
FIG. 2A is a sectional diagram illustrating a process to manufacture the semiconductor light emitting element illustrated in FIG. 1.
Figure 2B:
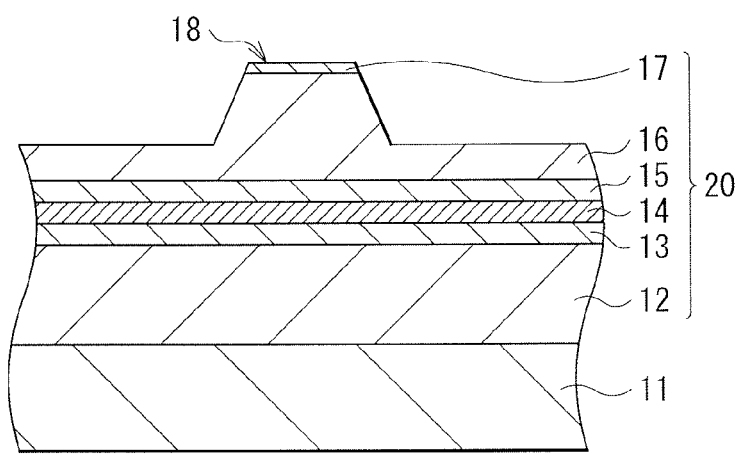
FIG. 2B is a sectional diagram illustrating a process following the process in FIG. 2A.
Figure 2C:
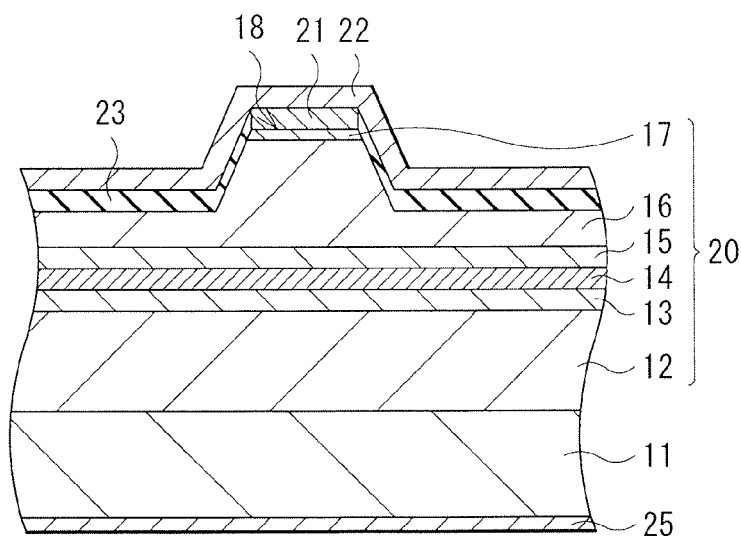
FIG. 2C is a sectional diagram illustrating a process following the process in FIG. 2B.

FIG. 2A to FIG. 2C are sectional diagrams illustrating the method of manufacturing the semiconductor light emitting element 10 in order of processes. The semiconductor light emitting element 10 may be manufactured by forming the semiconductor layer 20 on the substrate 11, for example, by an MOCVD (Metal Organic Chemical Vapor Deposition) method. In this case, for example, trimethylaluminum (TMA), trimethylgallium (TMG), trimethylindium (TMIn), ammonium ($NH_3$) and so forth may be used as a raw material of a GaN-based compound semiconductor, for example, monosilane ($SiH_4$) and so forth may be used as a raw material of a donor impurity, and for example, bis(cyclopentadienyl) magnesium ($Cp_2Mg$) and so forth may be used as a raw material of an acceptor impurity.

Specifically, first, the n-type cladding layer 12, the n-type guide layer 13, the active layer 14, the p-type guide layer 15, the p-type cladding layer 16, and the p-type contact layer 17 are laminated on the substrate 11 in this order as illustrated in FIG. 2A.

Next, a mask layer (not illustrated) may be selectively formed on, for example, the p-type contact layer 17. Thereafter, the entire of the p-type contact layer 17 and part of the p-type cladding layer 16 in an exposed region that is not covered with the mask layer are removed by a Reactive Ion Etching (RIE) method. Thereafter, the mask layer is removed. Thus, the belt-like ridge part 18 that extends in the axial direction is formed on an upper part of a semiconductor layer 20 as illustrated in FIG. 2B.

Next, after an insulation film has been deposited on a front surface of the semiconductor layer 20, lithographic treatment and an etching process are performed on the insulation film to form the insulation layer 23 having an opening on the p-type contact layer 17 of the ridge part 18 as illustrated in FIG. 2C. Thereafter, the p-side contact electrode layer 21 is so formed as to fill the opening of the insulation layer 23. Further, the lithographic treatment, the etching process, and a lift-off process are performed to form the p-side pad electrode layer 22 so as to cover the p-side contact electrode layer 21. Further, for example, after the back surface side of the substrate 11 is lapped to adjust the thickness of the substrate 11, the lithographic treatment, the etching process, and the lift-off process may be performed to form the n-side electrode layer 25. Further, the plating method such as the electroplating method is used to form the plated layer 24 so as to cover the p-side pad electrode layer 22. Manufacture of the semiconductor light emitting element 10 is completed by finally forming the reflector films (not illustrated) on one pair of end faces in the axial direction.

[Function and Effect of Semiconductor Light Emitting Element 10]

In the above-mentioned semiconductor light emitting element 10, when a predetermined voltage is applied between the p-side contact electrode layer 21 of the ridge part 18 and the n-side electrode layer 25, the current that has been current-blocked by the ridge part 18 is injected into the current injection region (the light emitting region). As a result, emission of light by re-combination of an electron with a hole occurs. The light so emitted is reflected by the one pair of reflector films, induces laser oscillation at a wavelength whose phase changes by an integer time of $2\pi$ when one reciprocal travel has been made, and is emitted to the outside as beams.

The semiconductor light emitting element 10 includes the semiconductor layer 20, the p-side contact electrode layer 21, the p-side pad electrode layer 22 that contains the hydrogen storage metal, and the plated layer 24 in order as described above. Since the plated layer 24 may be made of the material having the high thermal conductivity, such as Au, it is possible to immediately emit heat generated in association with light emitting operation performed by the semiconductor light emitting element 10, to the outside. Accordingly, it is possible to avoid heat-induced degradation of light emitting performance of the semiconductor light emitting element 10. In addition, the p-side pad electrode layer 22 that contains the hydrogen storage metal is provided between the p-side contact electrode layer 21 and the plated layer 24. Therefore, hydrogen that is contained in the plated layer 24 in association with the plating treatment is occluded in the hydrogen storage metal contained in the p-side pad electrode layer 22 and intrusion of hydrogen into the p-side contact electrode layer 21 is suppressed. As a result, it is possible to avoid deterioration of the crystal structure and increase in contact resistance of the p-side contact electrode layer 21, and thus the reliability is improved. In addition, since it is possible to configure the p-side contact electrode layer 21 by using the metal element having larger work function, the light emitting efficiency is improved and it is possible to reduce the voltage to drive the semiconductor light emitting element 10. In addition, since the heating treatment to be performed in order to emit the hydrogen contained in the plated layer 24 to the outside is not necessary, it is possible to simplify the manufacturing process and it is also possible to avoid heat damage to the semiconductor light emitting element 10.

<Second Embodiment>

[Structure of Semiconductor Light Emitting Device]

Figure 3A:
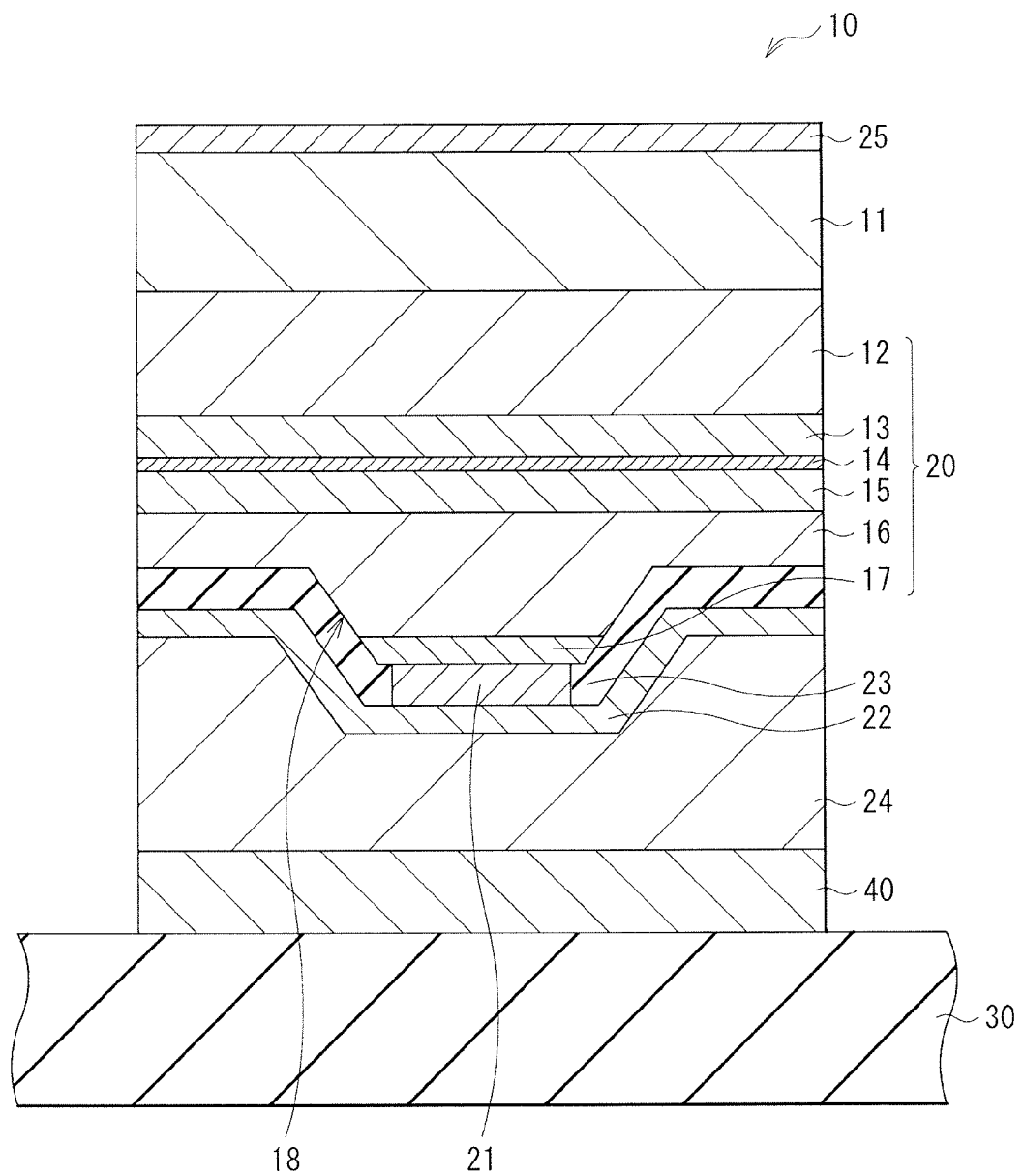
FIG. 3A is a sectional diagram illustrating a schematic structure of a semiconductor light emitting device according to a second embodiment of the present disclosure.

FIG. 3A is a sectional diagram illustrating a schematic structure of the semiconductor light emitting device according to an embodiment of the present disclosure.

The semiconductor light emitting device includes the semiconductor light emitting element 10 described in the above-mentioned first embodiment. Specifically, the semiconductor light emitting device has a structure that the semiconductor light emitting element 10 is joined to a support (a sub-mount) 30 as a base via a junction layer 40 as illustrated in FIG. 3A. However, the semiconductor light emitting element 10 is joined to the support 30 in a junction down state that the projected stripe part (the ridge part) 18 faces the support 30. Therefore, the plated layer 24, the p-side pad electrode layer 22, the p-side contact electrode layer 21, the semiconductor layer 20, the substrate 11, and the n-side electrode layer 25 are laminated in order from the support 30 side. The semiconductor layer 20 has a structure that the p-type contact layer 17, the p-type cladding layer 16, the p-type guide layer 15, the active layer 14, the n-type guide layer 13, and the n-type cladding layer 12 are laminated on the p-side contact electrode layer 21 in order. The junction layer 40 may be a solder layer made of, for example, AuSn.

Junction of the support 30 with the semiconductor light emitting element 10 via the junction layer 40 is performed in the following manner. Specifically, for example, Au that configures the plated layer 24 and Sn contained in AuSn that configures the junction layer 40 may be subjected to eutectic crystallization with the plated layer 24 of the semiconductor light emitting element 10 facing the junction layer 40 provided on the support 30.

In this case, it may sometimes occur that Sn contained in AuSn of the junction layer 40 diffuses across the entire area of the plated layer 24 or diffuses up to the p-side pad electrode layer 22 and the p-side contact electrode layer 21 depending on the eutectic crystallization condition, and therefore the light emitting performance of the semiconductor light emitting element 10 may be possibly deteriorated.

Figure 3B:
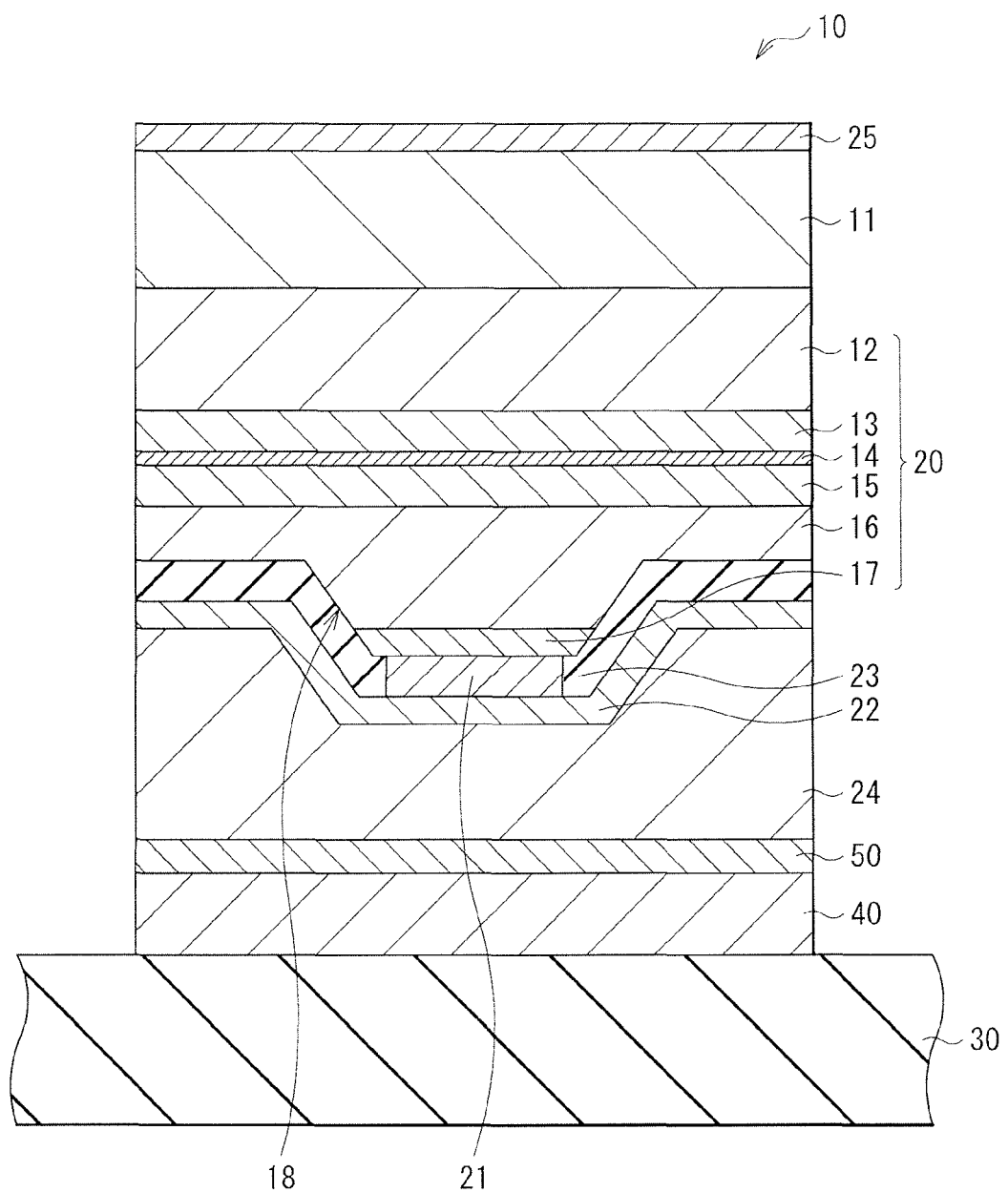
FIG. 3B is a sectional diagram illustrating a modification example of the semiconductor light emitting device according to the second embodiment of the present disclosure illustrated in FIG. 3A.

Accordingly, a barrier layer 50 may be so formed, for example, between the junction layer 40 and the plated layer 24 as to suppress diffusion of Sn into the plated layer 24 as illustrated in FIG. 3B. As the constitutional materials of the barrier layer 50, Ti (titanium), Pt (platinum), and so forth are preferable because these materials effectively block migration of Sn. In addition, the barrier layer 50 may have a film thickness of, for example, about 10 nm or more about 1 μm or less. It is to be noted that the position of the barrier layer 50 is not limited to that illustrated in FIG. 3B, and the barrier layer 50 may be formed, for example, between the plated layer 24 and the p-side pad electrode layer 22 or between the p-side pad electrode layer 22 and the p-side contact electrode layer 21.

[Function and Effect of Semiconductor Light Emitting Device]

In the semiconductor light emitting device according to the second embodiment of the present disclosure, the plated layer 24 made of the metal that is comparatively low in hardness and excellent in thermal conductivity, such as gold is provided between the semiconductor layer 20 and the support 30. Thus, the plated layer 24 functions as a shock absorber and therefore it is possible to mitigate a mechanical shock that would be given to the semiconductor layer 20 in a post-process and so forth. Thus, it is possible to secure the reliability of the semiconductor light emitting element 10. In addition, the plated layer 24 also functions as a heat radiation layer and therefore it is possible to immediately emit the heat generated in association with the light emitting operation performed by the semiconductor light emitting device 10 to the outside. Thus, it is possible to avoid heat-induced degradation of the light emitting performance of the semiconductor light emitting element 10. Further, since the p-side pad electrode layer 22 that contains the hydrogen storage metal is provided between the p-side contact electrode layer 21 and the plated layer 24, the same operational effects as those described in the above-mentioned first embodiment are obtained.

Although the present disclosure has been described by giving the embodiments as described above, the present disclosure is not limited to the above-mentioned embodiments and may be modified in a variety of ways. For example, materials and thicknesses of the respective layers may not be limited to the materials and the thicknesses that have been described in the above-mentioned embodiments and other materials and thicknesses may be adopted.

In addition, although in the above-mentioned embodiments, description has been made by giving the semiconductor light emitting element that includes the group III-V nitride semiconductor as an example, a semiconductor laser that includes another semiconductor may be also used.

It is to be noted that the present technology may be configured as follows.
(1) A semiconductor light emitting element, including:
 a semiconductor layer;
 an electrode layer;
 a metal layer that contains a hydrogen storage metal; and
 a plated layer in order.
(2) The semiconductor light emitting element according to (1), wherein
 the semiconductor layer is a nitride semiconductor layer,
 the electrode layer is a p-side electrode layer,
 the metal layer contains palladium (Pd) or nickel (Ni) or both of Pd and Ni as the hydrogen storage metal, and
 the plated layer contains gold.
(3) The semiconductor light emitting element according to (1) or (2), wherein
 the electrode layer has a multilayer structure including a layer that is in contact with the semiconductor layer and contains palladium (Pd).
(4) The semiconductor light emitting element according to any one of (1) to (3), wherein
 the metal layer has a multilayer structure including a palladium (Pd) layer and a nickel (Ni) layer.
(5) A semiconductor light emitting device, including:
 a base; and
 a semiconductor light emitting element, the semiconductor light emitting element being joined to the base via a junction layer and being configured by laminating a plated layer, a metal layer that contains a hydrogen storage metal, an electrode layer, and a semiconductor layer in order from the base side.
(6) The semiconductor light emitting device according to (5), wherein
 the semiconductor layer is a nitride semiconductor layer,
 the electrode layer is a p-side electrode layer,
 the metal layer contains palladium (Pd) or nickel (Ni) or both of Pd and Ni as the hydrogen storage metal, and
 the plated layer contains gold.
(7) The semiconductor light emitting device according to (5) or (6), further including
 a barrier layer between the junction layer and the electrode layer, wherein
 the junction layer is a solder layer that contains Sn (tin), and
 the barrier layer prevents diffusion of Sn.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emitting element, comprising, in order:
 a semiconductor layer;
 a contact layer;
 an electrode layer;
 a metal layer that contains at least one of Palladium (Pd) or Nickel (Ni) as a hydrogen storage metal and that serves as a pad electrode, the metal layer completely overlapping the electrode layer; and
 a plated layer distinct from the metal layer.

2. The semiconductor light emitting element according to claim 1, wherein:

the semiconductor layer is a nitride semiconductor layer,
the contact layer is a p-side contact layer,
the electrode layer is a p-side electrode layer, and
the plated layer contains gold.

3. The semiconductor light emitting element according to claim 1, wherein the electrode layer has a multilayer structure including a layer that is in contact with the semiconductor layer and contains palladium(Pd).

4. The semiconductor light emitting element according to claim 1, wherein the metal layer has a multilayer structure including a palladium (Pd) layer and a nickel (Ni) layer.

5. A semiconductor light emitting device, comprising:
a base; and
a semiconductor light emitting element, the semiconductor light emitting element joined to the base via a junction layer and configured by, in order from the base, a plated layer, a metal layer distinct from the plated layer that contains at least one of Palladium (Pd) or Nickel (Ni) as a hydrogen storage metal and that serves as a pad electrode, an electrode layer, a contact layer, and a semiconductor layer.

6. The semiconductor light emitting device according to claim 5, wherein:
the semiconductor layer is a nitride semiconductor layer,
the contact layer is a p-side contact layer,
the electrode layer is a p-side electrode layer, and
the plated layer contains gold.

7. The semiconductor light emitting device according to claim 5, further comprising a barrier layer between the junction layer and the electrode layer, wherein the junction layer is a solder layer that contains Sn (tin), and the barrier layer prevents diffusion of Sn.

\* \* \* \* \*